US007823308B1

(12) United States Patent  
Munson et al.

(10) Patent No.: US 7,823,308 B1
(45) Date of Patent: Nov. 2, 2010

(54) ELECTRONIC SIGN HAVING A FORMED METAL CABINET

(75) Inventors: Lane A. Munson, Brookings, SD (US); Cassandra L. Fuls, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 12/218,926

(22) Filed: Jul. 18, 2008

Related U.S. Application Data

(63) Continuation-in-part of application No. 11/809,107, filed on May 31, 2007.

(60) Provisional application No. 60/961,832, filed on Jul. 24, 2007.

(51) Int. Cl.
G09F 9/00 (2006.01)

(52) U.S. Cl. .............. 40/564; 40/448; 40/452; 40/605; 40/573; 345/1.1; 345/1.3

(58) Field of Classification Search ............ 40/735, 40/605, 576, 618, 446, 793, 611.02, 790, 40/574, 578, 564; 52/58, 572, 475.1
See application file for complete search history.

(56) References Cited

U.S. PATENT DOCUMENTS

| | | | |
|---|---|---|---|
| 1,853,927 A * | 4/1932 | Plym .................. 49/387 |
| 2,053,547 A | 9/1936 | Austin |
| 3,594,761 A | 7/1971 | Boesen |
| 4,234,914 A | 11/1980 | Boesen |
| 5,172,504 A | 12/1992 | De Maat et al. |
| 5,268,828 A | 12/1993 | Miura |
| 5,321,417 A | 6/1994 | Voelzke et al. |
| 5,647,152 A | 7/1997 | Miura |
| 5,692,855 A | 12/1997 | Burton |
| 5,715,619 A | 2/1998 | Polisois et al. |
| 5,758,442 A * | 6/1998 | Flanigan et al. ........ 40/624 |
| 6,065,612 A * | 5/2000 | Rinderer ............... 211/26 |
| 6,154,945 A | 12/2000 | Voelzke |
| 6,169,632 B1 | 1/2001 | Kurtenbach et al. |
| 6,179,514 B1 * | 1/2001 | Cheng ................. 403/377 |
| 6,314,669 B1 | 11/2001 | Tucker |
| 6,508,494 B1 | 1/2003 | Reuter et al. |
| D482,403 S | 11/2003 | Rose |
| 6,677,918 B2 | 1/2004 | Yuhara et al. |
| 6,729,054 B1 | 5/2004 | VanderTuin |

(Continued)

FOREIGN PATENT DOCUMENTS

JP        8140023   A2    5/1996

(Continued)

OTHER PUBLICATIONS

"U.S. Appl. No. 11/809,107, Final Office Action mailed May 21, 2009", 7 pgs.

(Continued)

Primary Examiner—Lesley Morris
Assistant Examiner—Shin Kim
(74) Attorney, Agent, or Firm—Schwegman, Lundberg & Woessner, P.A.

(57) ABSTRACT

An electronic sign having a formed metal cabinet where precise and close tolerance formed planar panels and formed channels are fastened together only by rivets, nut inserts, adhesive coated tapes, or the combination thereof for rapid assembly thereof.

20 Claims, 15 Drawing Sheets

U.S. PATENT DOCUMENTS

| | | | |
|---|---|---|---|
| 6,741,222 B1 * | 5/2004 | Tucker | 345/1.1 |
| 6,813,853 B1 * | 11/2004 | Tucker | 40/448 |
| 7,091,933 B2 | 8/2006 | McClintock et al. | |
| 7,225,586 B2 * | 6/2007 | Levesque et al. | 49/506 |
| 7,373,747 B1 | 5/2008 | Wiemer et al. | |
| 7,448,154 B1 * | 11/2008 | Kludt | 40/446 |
| 7,694,444 B2 | 4/2010 | Miller et al. | |
| 2003/0217495 A1 | 11/2003 | Nagamine et al. | |
| 2008/0060234 A1 | 3/2008 | Chou | |

FOREIGN PATENT DOCUMENTS

| | | | |
|---|---|---|---|
| JP | 11265153 A2 | 9/1999 | |
| JP | 2001350434 A2 | 12/2001 | |

OTHER PUBLICATIONS

"U.S. Appl. No. 11/809,107, Notice of Allowance mailed Nov. 27, 2009", 8 Pgs.

"U.S. Appl. No. 11/809,107, Response filed Aug. 21, 2009 to Final Office Action mailed May 21, 2009", 12 pgs.

"European Application No. 08165444.4, European search report mailed Mar. 4, 2009", 9 pgs.

* cited by examiner

ELECTRONIC SIGN HAVING A FORMED METAL CABINET

CROSS REFERENCES TO RELATED APPLICATIONS

This patent application is a continuation-in-part (CIP) of application Ser. No. 11/809,107 filed May 31, 2007, entitled "Electronic Sign Having a Formed Metal Cabinet", which is pending.

This application claims priority from the earlier filed U.S. Provisional Application No. 60/961,832 filed Jul. 24, 2007, entitled "Electronic Sign Having a Formed Metal Cabinet", and is hereby incorporated into this application by reference as if fully set forth herein.

This application is related to U.S. utility patent application Ser. No. 10/688,304 filed Oct. 17, 2003, entitled "Electronic Display Module Having a Four-Point Latching System for Incorporation into an Electronic Sign and Process", now U.S. Pat. No. 7,055,271 to Lutz et al., patented Jun. 6, 2006, which is incorporated herein by reference.

BACKGROUND OF THE INVENTION

1. Field of the Invention

The present invention is for an electronic sign, and more particularly, pertains to the construction of an electronic sign by using precise formed structures, rivets, nut inserts, and adhesive coated tape to assemble structural members of the sign. An alternative embodiment includes the use of formed mid-channels, one or more formed front mounting channels, and one or more formed rear channels.

2. Description of the Prior Art

Prior art electronic signs included a cabinet structure which was labor intensive in constructing and, therefore, time consuming, requiring alignment of components and subsequent drilling, riveting, welding and other techniques. In addition, the components used for the fabrication of sign cabinets were extruded and not reliably true and straight, whereby suitable mating of components to the cabinet or mating of one cabinet to another adjacent cabinet proved to be not entirely satisfactory.

SUMMARY OF THE INVENTION

The general purpose of the present invention is to provide an electronic sign having a formed metal cabinet, whereby the cabinet can be fabricated using precision formed channels, precision formed panels, and the like. A plurality of formed components, which can include precision cut or stamped channels, is combined to make a formed metal cabinet for use with electronic display modules to provide an electronic sign having a formed metal cabinet. The components are considered to be formed components made by precise cutting, stamping, bending, laser cutting, and the like in order to provide uniformly shaped components of close tolerance and fit which can be planar two dimensional components or which can be multiple faced components in more than one plane. A plurality of vertically oriented formed channels and formed mid-channels is secured and aligned between a formed top channel and a formed bottom channel. Formed top, bottom and end panels include a plurality of different sized counterbored holes which can accommodate the flush mounting of rivet heads or nut insert heads. A double-sided adhesive coated tape is used to secure and seal the formed top, bottom, and end panels to the appropriate formed channels and formed mid-channels. A mounting panel for accommodating electronic display modules has counterbored holes therein to accommodate rivet heads. A double-sided adhesive coated tape is used to secure and sealingly fasten the mounting panel to the front lips of vertically oriented formed channels and formed mid-channels and to the front lip of the formed top channel and to the front lip of the bottom formed channel. A rear access panel is sealingly secured to the back lips of the vertically oriented formed channels and formed mid-channels and to the back lips of the formed top and bottom channels by the use of rivets and a double-sided adhesive coated tape. The flush mounting feature of using counterbored holes allows for the vertical or horizontal alignment of one electronic sign to an adjacent electronic sign without any rivet head interference. The use of rivets and nut inserts in conjunction with the use of a double-sided adhesive coated tape allows for the rapid assembly of the formed metal cabinet without having to drill matching holes between planar or channel components and without using other labor intensive construction techniques.

According to one or more embodiments or illustrations of the present invention, there is provided an electronic sign having a formed metal cabinet, including a central portion with vertically oriented formed channels, vertically oriented formed mid-channels, horizontally oriented top and bottom formed channels, horizontally oriented formed top and bottom panels, vertically oriented formed end panels, a mounting panel for accommodating electronic display modules, a rear access panel having access door panels, a plurality of double-sided adhesive coated tapes, and a plurality of rivets and nut inserts.

According to an alternative embodiment of the present invention, there is provided an electronic sign having a formed metal cabinet, including a formed front mounting channel for accommodating electronic display modules, formed rear channels having rear access door panels, horizontally oriented formed top and bottom panels, vertically oriented formed side panels, a plurality of double sided adhesive tapes and a plurality of rivets, nut inserts and the like.

Significant aspects and features of the present invention are included which generally are common for both the preferred embodiment and the alternative embodiment. References addressing only the alternative embodiment are prefaced with the phrase "in the alternative embodiment".

One significant aspect and feature of the present invention is to provide an electronic sign having a formed metal cabinet.

Another significant aspect and feature of the present invention is the use of precision cut and close tolerance formed planar panels or formed channels for simplifying the assembly process.

Still another significant aspect and feature of the present invention is the use of planar formed panels having counterbored holes for flush accommodation of rivet heads and rivet bodies and for flush accommodation of insert nut heads and bodies.

Yet another significant aspect and feature of the present invention is the use of a plurality of rivets and nut inserts or combinations thereof to fasten adjacent formed components.

A further significant aspect and feature of the present invention is the use of a double-sided adhesive coated tape as a seal and as an attachment interface between formed components.

Yet another significant aspect and feature of the present invention is the use of a plurality of rivets and nut inserts or combinations thereof in combination with a double-sided adhesive coated tape to fasten adjacent formed components.

Still another significant aspect and feature of the present invention is the use of formed sheet metal for supports instead of metal extrusions.

Yet another significant aspect and feature of the present invention is the use of formed sheet metal for supports instead of metal extrusions, whereby sheet metal can be formed more accurately and precisely than metal can be extruded.

Still another significant aspect and feature of the present invention is the use of rivets, nut inserts, and double-sided adhesive coated tape for fastening instead of weldments which require transfer of components in different stages of assembly to one or more welding areas.

Still another significant aspect and feature of the present invention is the use of prepunched and precounterbored holes that were punched by a CNC machine.

In the alternative embodiment, the use of the formed front mounting channels and formed rear channels reduces the quantity of required components to fashion a formed metal cabinet.

In the alternative embodiment, the use of formed front mounting channels and formed rear access panels provides means for affording structural integrity of the formed metal cabinet.

In the alternative embodiment, a simpler and quicker construction reduces fabrication time and effort.

Having thus briefly described embodiments of the present invention and having mentioned some significant aspects and features of the present invention, it is the principal object of the present invention to provide an electronic sign having a formed metal cabinet.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
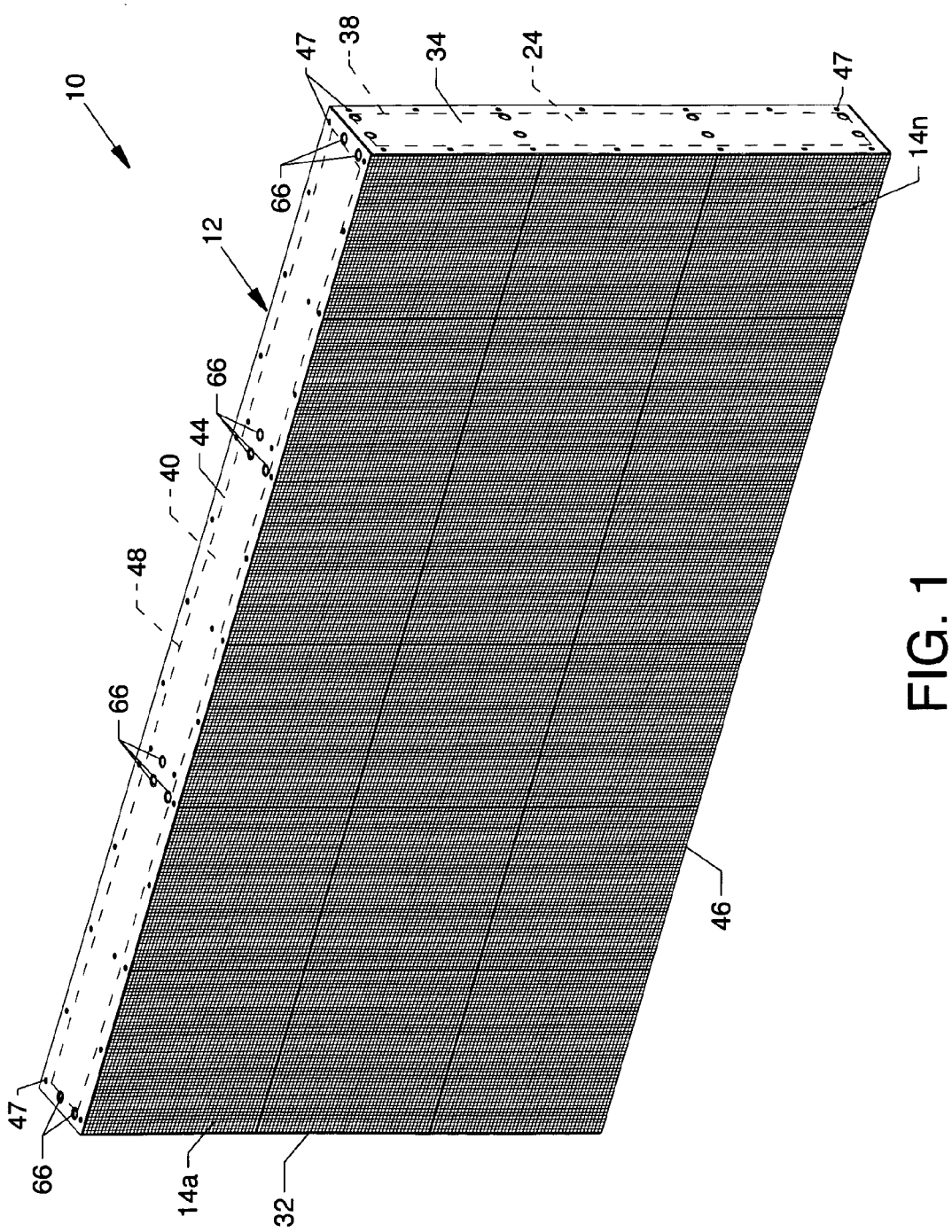
FIG. 1 is a front isometric view of an electronic sign having a formed metal cabinet, the present invention.
Figure 2:
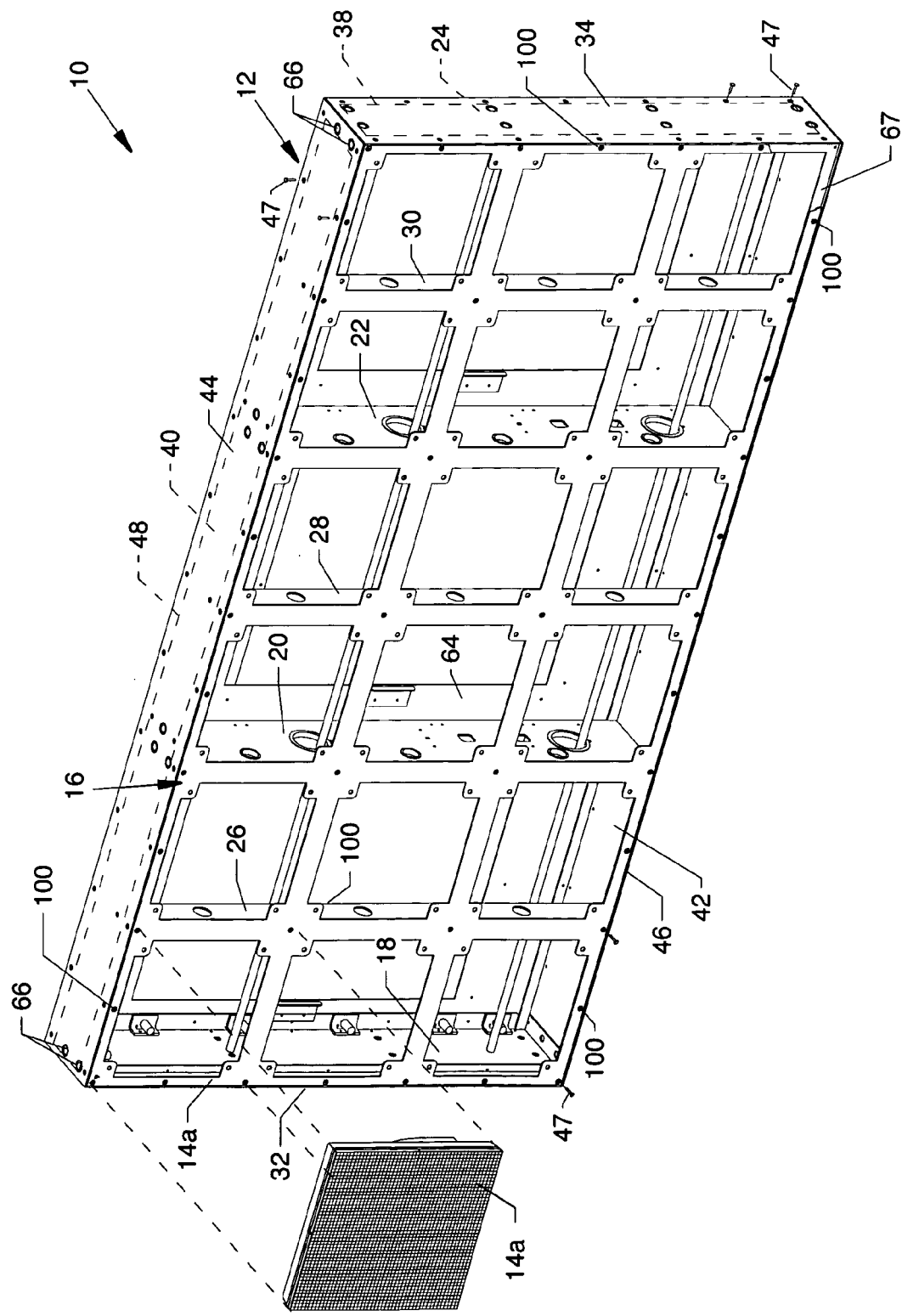
FIG. 2 is a front isometric view of an electronic sign having a formed metal cabinet where one display module is shown distanced from a mounting panel.

FIG. 1 is a front isometric view of an electronic sign 10 having a formed metal cabinet 12, the present invention. A plurality of electronic display modules having a four-point latching system, herein referred to as the display modules 14a-14n, removably attach to the front of a formed metal cabinet 12. FIG. 2 is a front isometric view of an electronic sign having a formed metal cabinet 12 where only one display module 14a is shown distanced from a mounting panel 16. The mounting panel 16, a part of the formed metal cabinet 12, is used to mount the plurality of display modules 14a-14n. The relationship of the mounting panel 16 and the display modules 14a-14n is described in U.S. Pat. No. 7,055,271 entitled "Electronic Display Module Having a Four-Point Latching System for Incorporation into an Electronic Sign and Process". Other components of the formed metal cabinet 12 are viewable through the structure of the mounting panel 16 and are described later in detail, whereby reference to FIG. 2 is beneficial.

Figure 3:
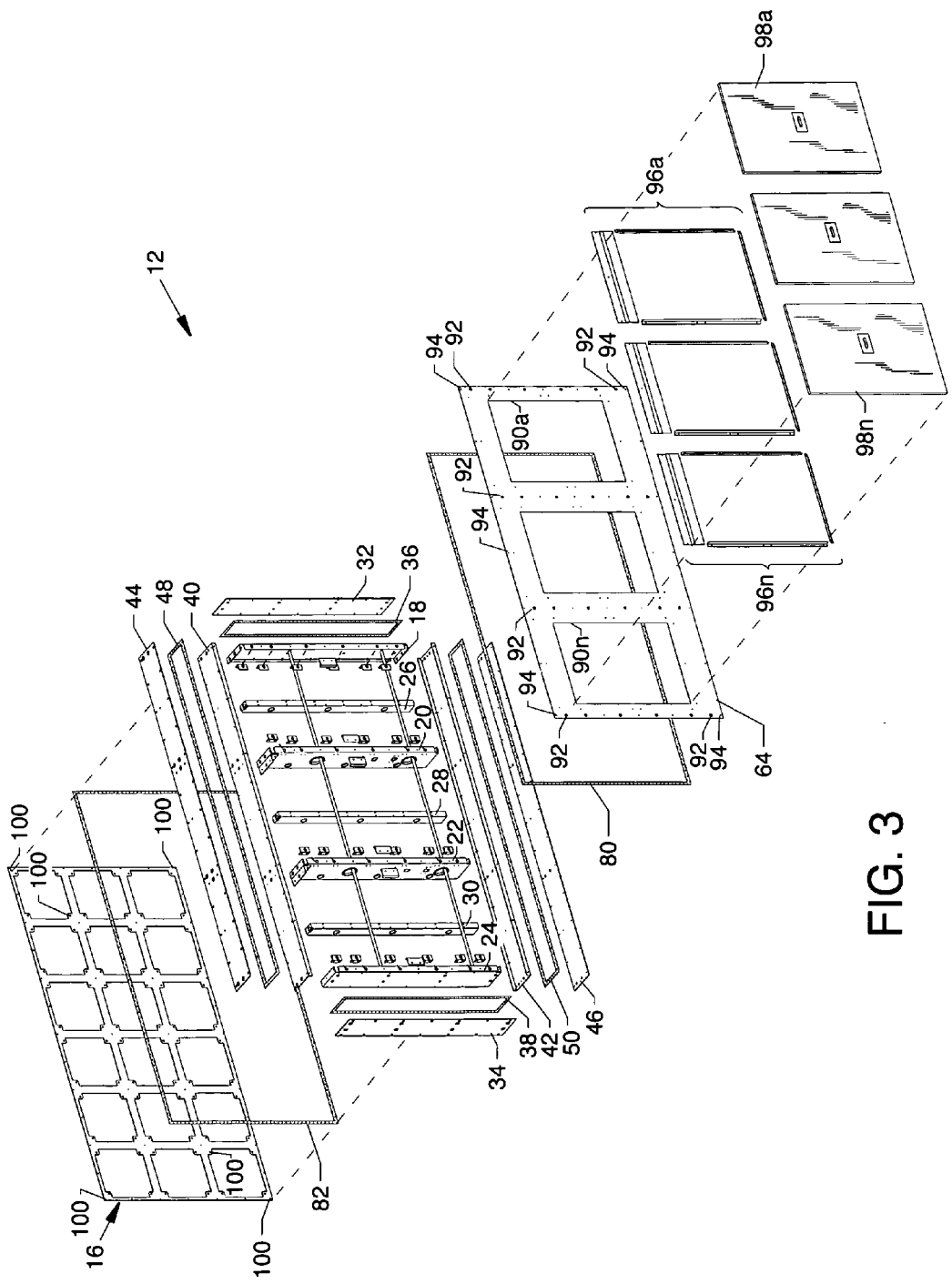
FIG. 3 is an exploded rear isometric view of the formed metal cabinet.
Figure 4:
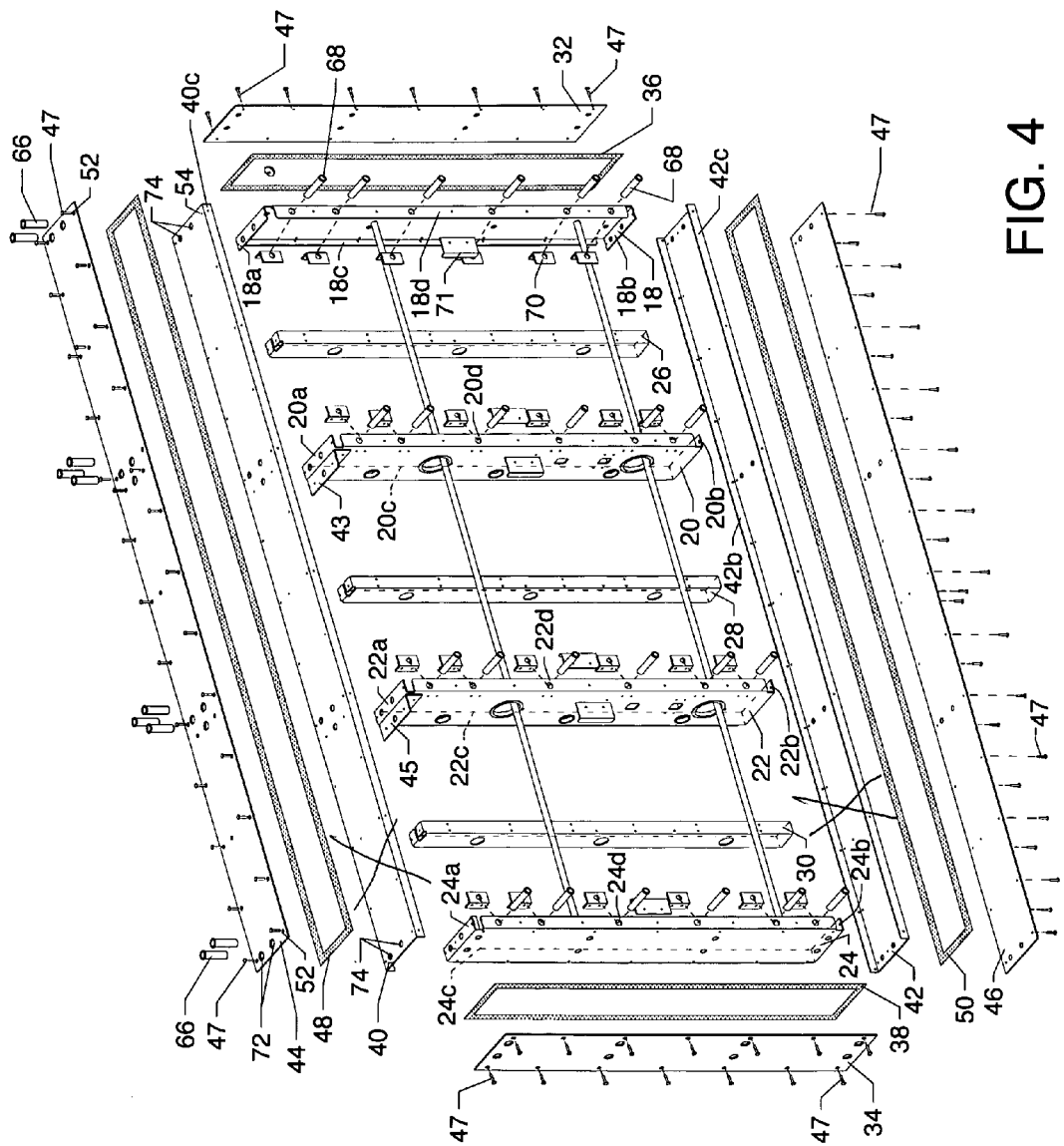
FIG. 4 is an exploded rear isometric view of the formed channel and formed planar components at the central portion of the formed metal cabinet.
Figure 5:
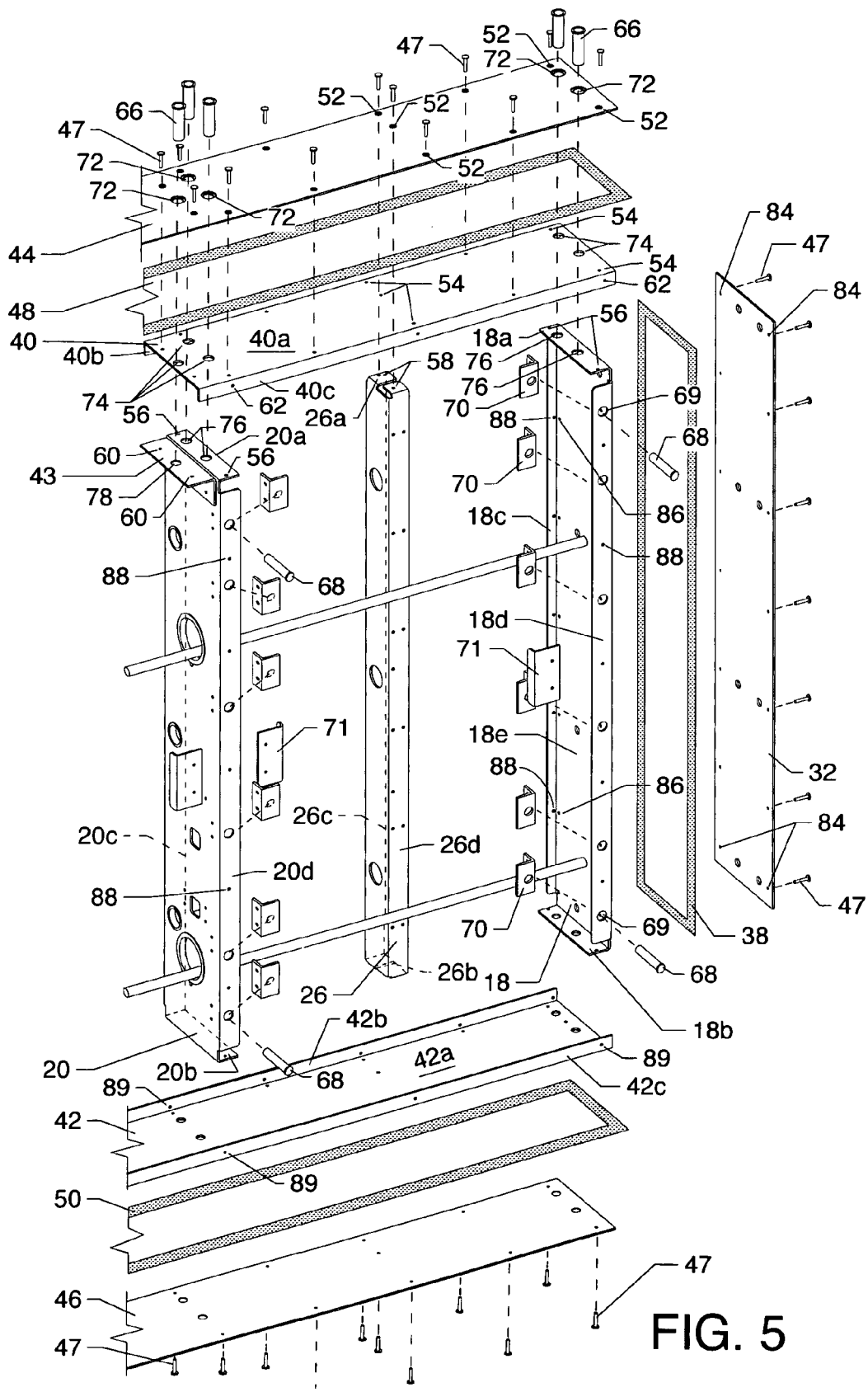
FIG. 5 is an amplified view of one end of the invention including components above and below, as well as to one side of a plurality of formed channel components, as well as other closely associated components.

FIG. 3 is an exploded rear isometric view of the formed metal cabinet 12, FIG. 4 is an exploded rear isometric view of the formed channel and formed planar components at the central portion of the formed metal cabinet 12, and FIG. 5 is an amplified view of one end of the invention where each view includes components above and below, as well as to one or more sides of a plurality of formed channel components, as well as other closely associated components. All of the components are considered to be formed by one or more methods including, but not limited to, punching, bending, laser cutting or combinations thereof with great precision, close tolerance and uniformity. Such components can be a panel or a formed channel or other associated structure, each being utilized to facilitate rapid component assembly and to produce a formed metal cabinet 12 having geometric uniformity and conformity.

The central portion of the formed metal cabinet 12 includes horizontally and vertically aligned components which are of precisely formed and punched metal configuration including vertically aligned full width formed channels 18, 20, 22 and 24, where full width formed channels 18 and 24 are located at the ends of the formed metal cabinet 12. Also included in the central portion are partial width formed mid-channels 26, 28 and 30 and formed end panels 32 and 34. Vertically oriented adhesive coated tapes 36 and 38, having an adhesive coating on opposite sides thereof and having a large central tape-free and adhesive-free region, are provided as sealing and attachment interfaces between the formed channel 18 and the formed end panel 32 and also between the formed channel 24 and the formed end panel 34, respectively. The double-sided adhesive coated tapes, such as tapes 36 and 38 and other such similar adhesive coated tapes incorporated herein, can be, but not limited to, 3M 5925 VHB (very high bond) Acrylic Foam Tape which is suitable for indoor or outdoor use. Other precisely formed and punched metal formations include a horizontally aligned formed top channel 40 and an opposed formed bottom channel 42 where the formed top channel 40 is aligned with and intimately secured to respectively, and to brackets 43 and 45, such as by a plurality of rivets 47, to the top of the formed channels 20 and 22, and to the tops of the formed mid-channels 26, 28 and 30, respectively, by the use of rivets 47, where such rivets 47 are commonly used at a plurality of locations along and about the invention. Similarly, the formed bottom channel 42 is attached to the bottom lips 18b, 20b, 22b and 24b of the formed channels 18, 20, 22 and 24 and the bottoms of the formed mid-channels 26, 28 and 30 by the use of rivets 47.

Front and rear support and backing surfaces for the formed metal cabinet 12 are also provided. The back side lips 18d, 20d, 22d and 24d of the full width formed channels 18, 20, 22 and 24 are notched at their tops and bottoms in order to be in flush alignment with the back side lip 40c of the formed top channel 40 and to a back side lip 42c of the formed bottom channel 42 in order to form a combined structure for backing and supporting a rear access panel 64 (shown in FIG. 3). Additionally, the back side lip 18d of the formed channel 18, the back side lip 40c of the formed top channel 40, the back side lip 42c of the formed bottom channel 42, and the back side lip 24d of the formed channel 24 form a rear rectangular perimeter structure 65 (FIG. 6) for accommodating of a vertically oriented adhesive coated tape 80, having an adhesive on opposite sides thereof and having a large central tape-free and adhesive-free region, as a sealing and attachment interface with the front surface of the rear access panel 64. In a related fashion, the front side lips 18c, 20c, 22c and 24c of the full width formed channels 18, 20, 22 and 24 and the front side lip 26c and corresponding side lips of the formed mid-channels 26, 28 and 30, respectively, are notched at their tops and bottoms in order to be in flush alignment with the front side lip 40b of the formed top channel 40 and with front side lip 42b of the formed bottom channel 42, thus forming a combined structure for backing and supporting the front mounting panel 16. Additionally, the front side lip 18c of the formed channel 18, the front side lip 40b of the formed top channel 40, the front side lip 42b of the formed bottom channel 42 and the front side lip 24c of the formed channel 24 form a front rectangular perimeter structure 67 (FIG. 2) for accommodating a vertically oriented adhesive coated tape 82 (FIGS. 3 and 6), having an adhesive coating on opposite sides thereof and having a large central tape-free and adhesive-free region, as a sealing and attachment interface with the rear surface of the mounting panel 16. Other precisely formed and punched metal formations include formed top and bottom panels 44 and 46. Horizontally oriented adhesive coated tapes 48 and 50, each tape having an adhesive on opposite sides thereof and having a large central tape-free and adhesive-free region, are provided as sealing and attachment interfaces between the formed top channel 40 and the top panel 44 and between the formed bottom channel 42 and the formed bottom panel 46, respectively.

Precision punched holes are provided in the various formed metal structures for use with rivets and nut inserts. Holes of various sizes are used for riveting and mounting and accommodation of nut inserts. For example and illustration, the method of riveting is described with brief reference to FIG. 5. A plurality of counterbored holes 52 are distributed along the formed top panel 44 in order to intimately engage the body of a rivet and to accommodate the head of a rivet in a flush fashion and, correspondingly, a plurality of body holes 54 are distributed along the main panel 40a of the formed top channel 40 in order to intimately engage and accommodate rivet bodies. Further, corresponding pluralities of clench holes 56 for intimate binding engagement with the flared bottom of rivets are provided for securing the formed top channel 40 and the formed top panel 44 to other components, as follows. Clench holes 56 are provided in a top lip 18a of the formed end channel 18 and in the top lips of the other end channels. A plurality of clench holes 58 are provided in the segmented top lip 26a of the formed mid-channel 26, and a plurality of clench holes 60 are located in the top of the brackets 43 and 45. Other groups of clench holes 62 are distributed along the back and front side lips 40c and 40b, respectively, of the formed top channel 40 for fastening of the upper region of a rear access panel 64 and the upper region of the mounting panel 16, respectively. Corresponding holes for accommodating rivets are used in mirror image in corresponding like structures, such as the formed bottom channel 42 and the formed bottom panel 46, and are utilized in a similar manner for connecting the formed bottom channel 42 and the formed bottom panel 46 to the bottom lips 18b, 20b, 22b and 24b of the formed channels 18, 20, 22 and 24 and to the bottom lip 26b and other like corresponding lips of the formed mid-channels 26, 28 and 30.

Referring to FIG. 5, a plurality of nut inserts 66 are incorporated into the upper structure of the formed metal cabinet 12, as well as nut inserts 68, into the rear structure of the formed metal cabinet 12. Such nut inserts can be installed in other regions as required. A plurality of nut inserts 68, which secure through a plurality of counterbored holes 69 in the back side lip 18d of the formed channel 18 and through structural brackets 70, the latter of which are secured by rivets 47 to the main panel 18e of the formed channel 18, can be used for fastening the formed metal cabinet 12 to an external support structure. A plurality of structural brackets 71 are also provided and attached to the inside rear surface of the rear access panel 64 by rivets 47. Nut inserts 68 and associated structural brackets 70 are also installed in the same fashion in the formed channels 20, 22 and 24. Nut inserts 66 located at the upper region of the formed metal cabinet 12 can be used for the attachment of eye bolts or other suspension hardware. The formed top panel 44 includes a plurality of counterbored holes 72 distributed along and thereabout for flush accommodation of the annular top ring portion of the nut inserts 66, as well as for accommodation of the tubular section of the nut inserts 66 and for intimate engagement of the top portion of a nut insert 66 thereto and therein. A plurality of body holes 74 located along the formed top channel 40 allow passage of the tubular section of the nut inserts 66. A plurality of clench holes 76 in the top lip 18a of the formed end channel 18 and a plurality of clench holes 78 in the brackets 43 and 45 accommodate the tubular section of the nut inserts 66 for intimate engagement therewith by the flared bottom of the nut inserts 66. Body holes for nut inserts are also provided in the same manner in the formed channels 20, 22 and 24. The formed end panel 32 includes a plurality of counterbored holes 84 which accommodate a plurality of rivets 47 which are secured at a plurality of clench holes 86 located along and about the main panel 18e of the formed channel 18. The opposed formed end panel 34 is secured to the formed channel 24 in the same manner. A plurality of clench holes 88 are provided in lips 18c and 18d of the formed channel 18 and similar clench holes are also provided in the lips of the formed channels 20, 22 and 24 to thereby secure the mounting panel 16 and the rear access panel 64.

Other fastening features and components of the invention are now described with particular reference to FIG. 3. The rear access panel 64 has a plurality of openings 90a-90n therein for providing access to the interior of the formed metal cabinet 12. A plurality of counterbored holes 92 for accommodating the heads and bodies of nut inserts 68 and a plurality of clench holes 94 for accommodating a plurality of rivets 47 are located along and about the rear access panel 64 for use in fastening the rear access panel 64 to the rear of the central portion of the formed metal cabinet 12. More specifically, the rivets 47 (not shown in FIG. 3) are secured to the appropriately located clench holes 62 and through any other associated clench holes as applicably located in the formed top channel 40, as well as in the clench holes 88 in the back lips of the formed channels 18, 20, 22 and 24 and clench holes 89 in the back lip 42c of the formed bottom channel 42. A plurality of access door frames 96a-96n are attached, by rivets, to the rear access panel 64 around and about the openings 90a-90n therein. A plurality of removably attachable access door panels 98a-98n engage the access door frames 96a-96n and openings 90a-90n. A plurality of counterbored holes 100 are located along and about the perimeter of the front mounting panel 16 for accommodating the heads and bodies of rivets 47 which attach the front mounting panel 16 to the front area of the central portion of the formed metal cabinet 12. More specifically, rivets 47 are secured to the appropriately located clench holes 62 and to any other associated clench holes as applicably located in the front side lip 40b of the formed top channel 40, as well as in clench holes 88 (FIG. 5) located in the front side lips of the formed channels 18, 20, 22 and 24, the clench holes (not shown) in the front side lips of the formed mid-channels 26, 28 and 30 and the clench holes 89 in the front side lip 42b of the formed bottom channel 42.

Figure 6:
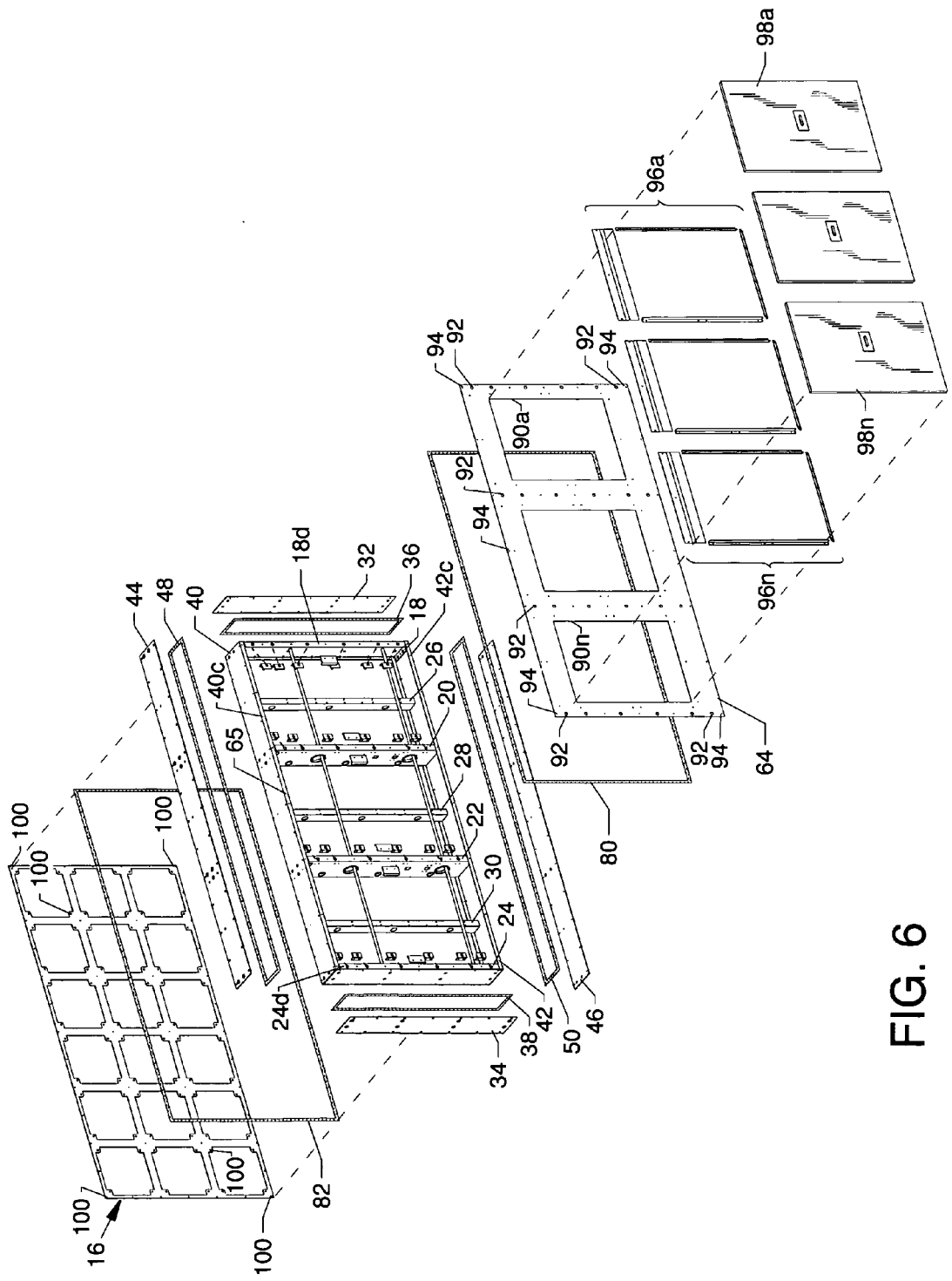
FIG. 6 is similar to FIG. 3 showing assembled centrally located components.

FIG. 6 is similar to FIG. 3 but shows the assembled centrally located components. The formed channels 18, 20, 22 and 24 and the formed mid-channels 26, 28 and 30 are shown secured between the formed top channel 40 and the formed bottom channel 42. The adhesive coated tape 48 is shown prior to its installation between the formed top channel 40 and the formed top panel 44, the adhesive coated tape 50 is shown prior to its installation between the formed bottom channel 42 and the formed bottom panel 46, the adhesive coated tape 38 is shown prior to its installation between the formed channel 24 and the formed end panel 34, and the adhesive coated tape 36 is shown prior to its installation between the formed channel 18 and the formed end panel 32.

Figure 7:
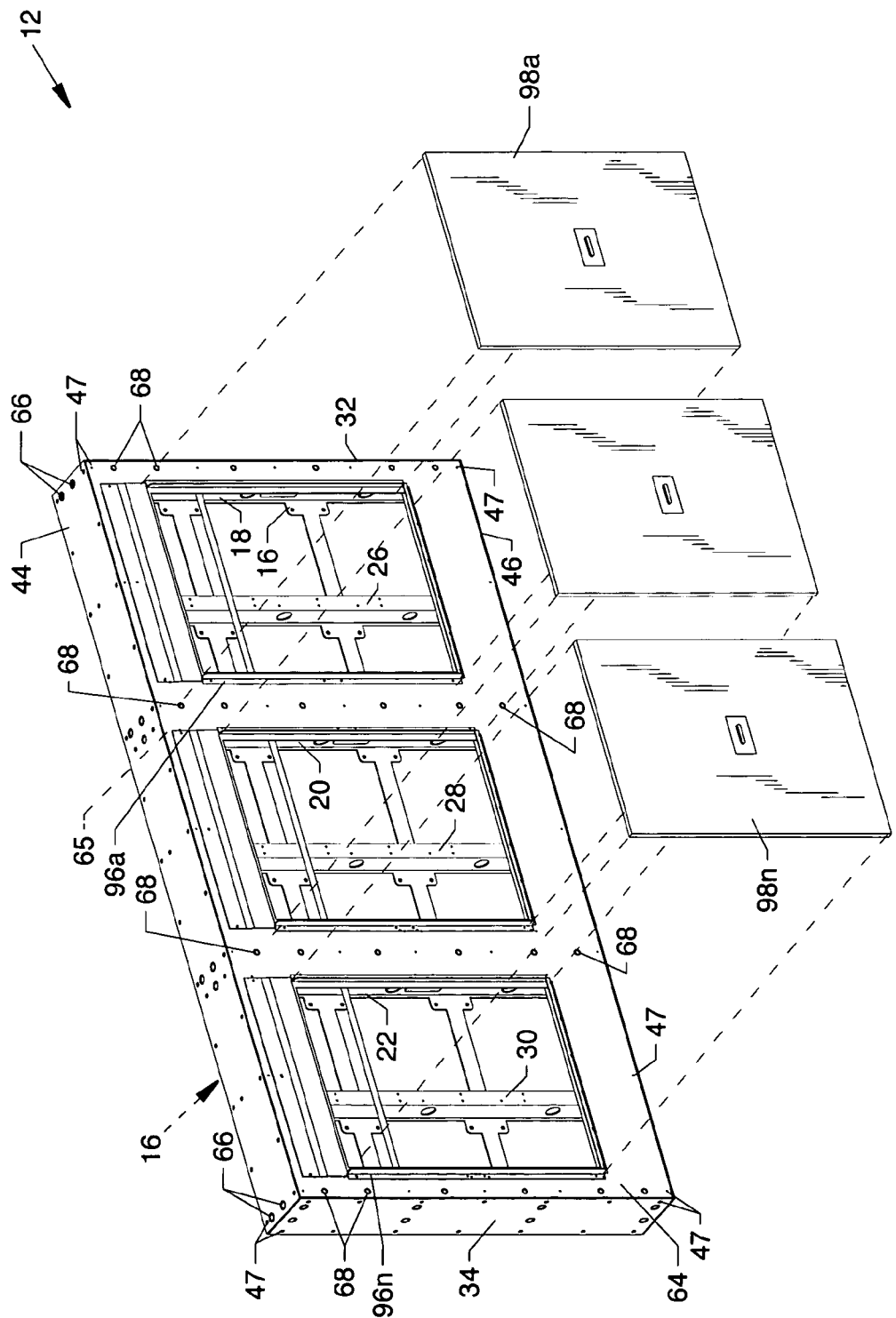
FIG. 7 is a partially exploded view of the formed metal cabinet where the access door panels are shown distanced therefrom.

FIG. 7 is a partially exploded view of the formed metal cabinet 12 where the access door panels 98a-98n are shown distanced from the main structure. The formed top panel 44 is secured to the formed top channel 40 by the use of rivets 47 and nut inserts 66 and by the adhesive coated tape 48 (not shown) therebetween. The formed bottom panel 46 is secured to the formed bottom channel 42 by the use of rivets 47 and by the adhesive coated tape 48 (not shown) therebetween. The formed end panel 34 is secured to the formed end channel 24 by the use of rivets 47 and by the adhesive coated tape 38 (not shown) therebetween. The formed end panel 32 is secured to the formed end channel 18 by the use of rivets 47 and by the adhesive coated tape 36 (not shown) therebetween. The rear access panel 64 is shown fastened to the rear rectangular perimeter structure 65 by the use of rivets 47 and nut inserts 66 and by the adhesive coated tape 80 (not shown) therebetween. The mounting panel 16 is shown fastened to the front rectangular perimeter structure 67 (FIG. 2) by the use of rivets 47 and by the adhesive coated tape 82 (not shown) therebetween.

MODE OF OPERATION

Pluralities of precise and close tolerance formed planar panels, formed channels, a mounting panel, a rear access panel, and other closely associated components are assembled using adhesive coated tapes interfacing between multiple arrangements in conjunction and in combination with pluralities of rivets and nut inserts which together mutually secure and attach such components.

DETAILED DESCRIPTION OF THE ALTERNATIVE EMBODIMENT

Figure 8:
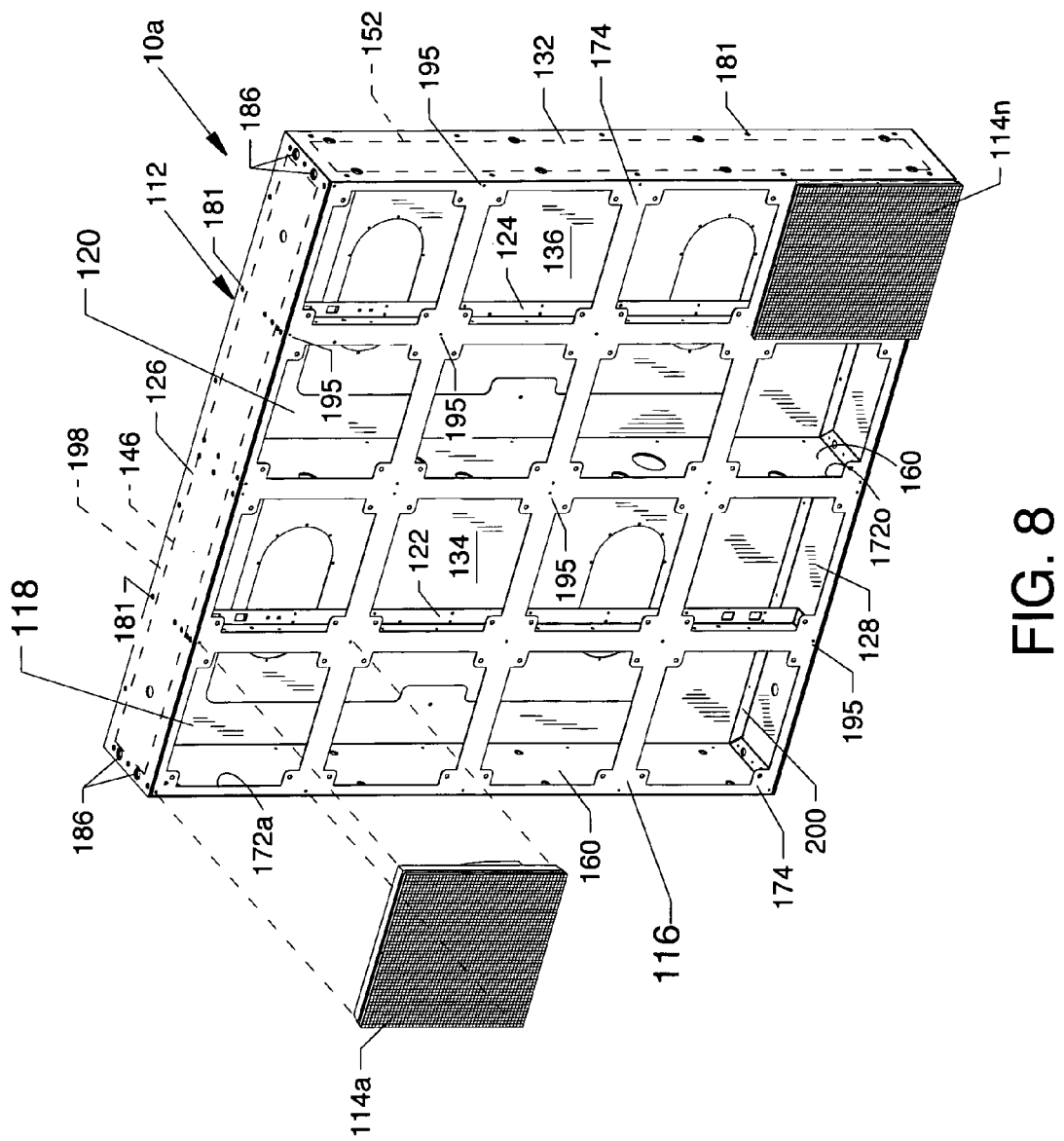
FIG. 8 is a front isometric view of an alternative embodiment of the present invention.

FIG. 8 is a front isometric view of an electronic sign 10a, an alternative embodiment of the present invention having a formed metal cabinet 112 shown in different proportion and/or size with respect to the preferred embodiment, but adhering to the teachings and scope of the present invention. A plurality of electronic display modules having a four-point latching system, herein referred to as the display modules 114a-114n (114a and 114n shown), are removably attached to the formed front mounting channel 116 of the formed metal cabinet 112. The display module 114a is shown spaced from the formed front mounting channel 116 and display module 114n is shown secured to the formed front mounting channel 116. The formed front mounting channel 116, a part of the formed metal cabinet 112, is used to mount the plurality of display modules 114a-114n. The relationship of the formed front mounting channel 116 and the display modules 114a-114n is described in U.S. Pat. No. 7,055,271 entitled "Electronic Display Module Having a Four-Point Latching System for Incorporation into an Electronic Sign and Process". Other components of the formed metal cabinet 112 are viewable through the structure of the formed front mounting channel 116 and are described later in detail, whereby reference to other figures is beneficial.

Figure 9:
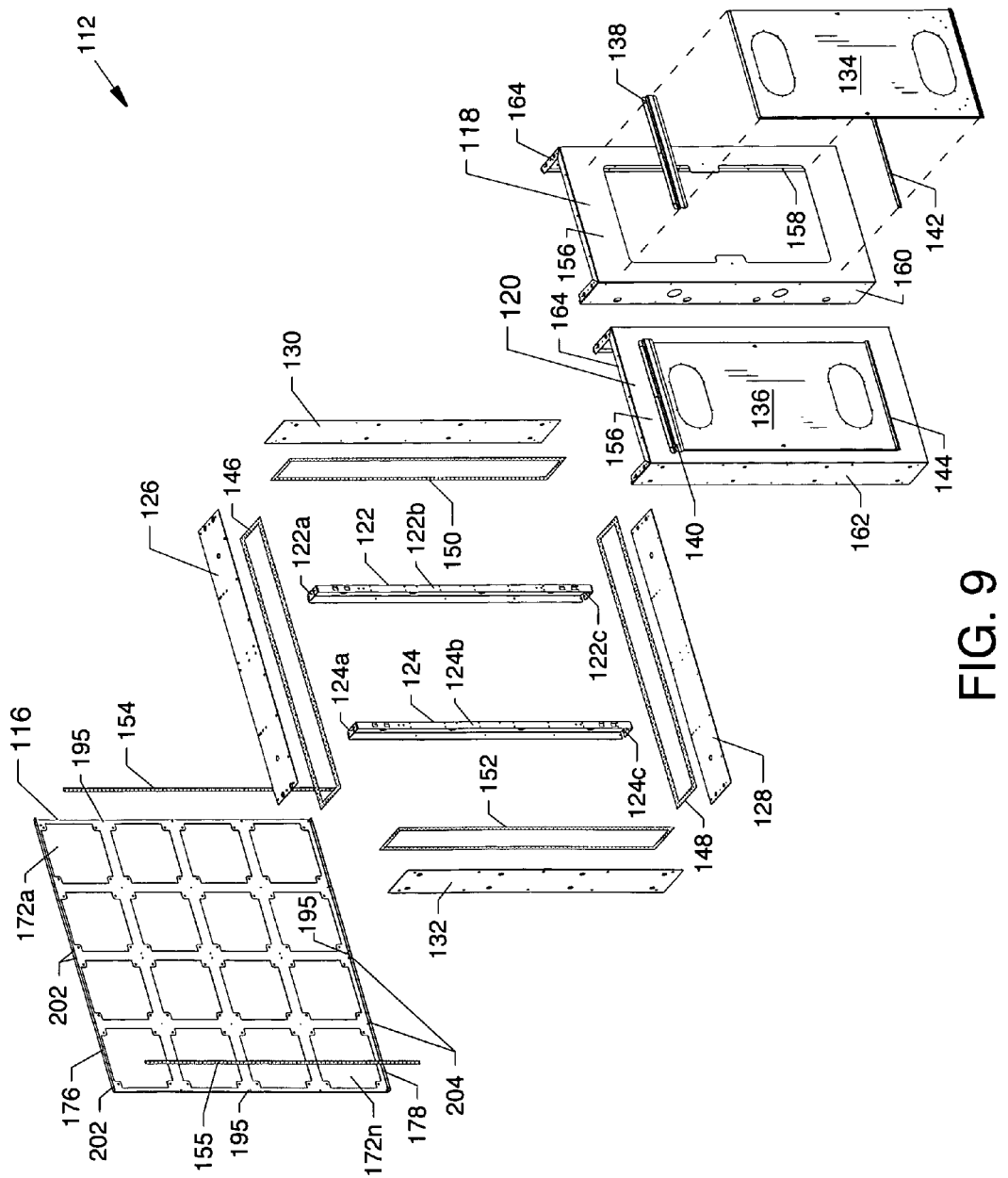
FIG. 9 is a semi-exploded rear isometric view of the formed metal cabinet shown in FIG. 8.
Figure 10:
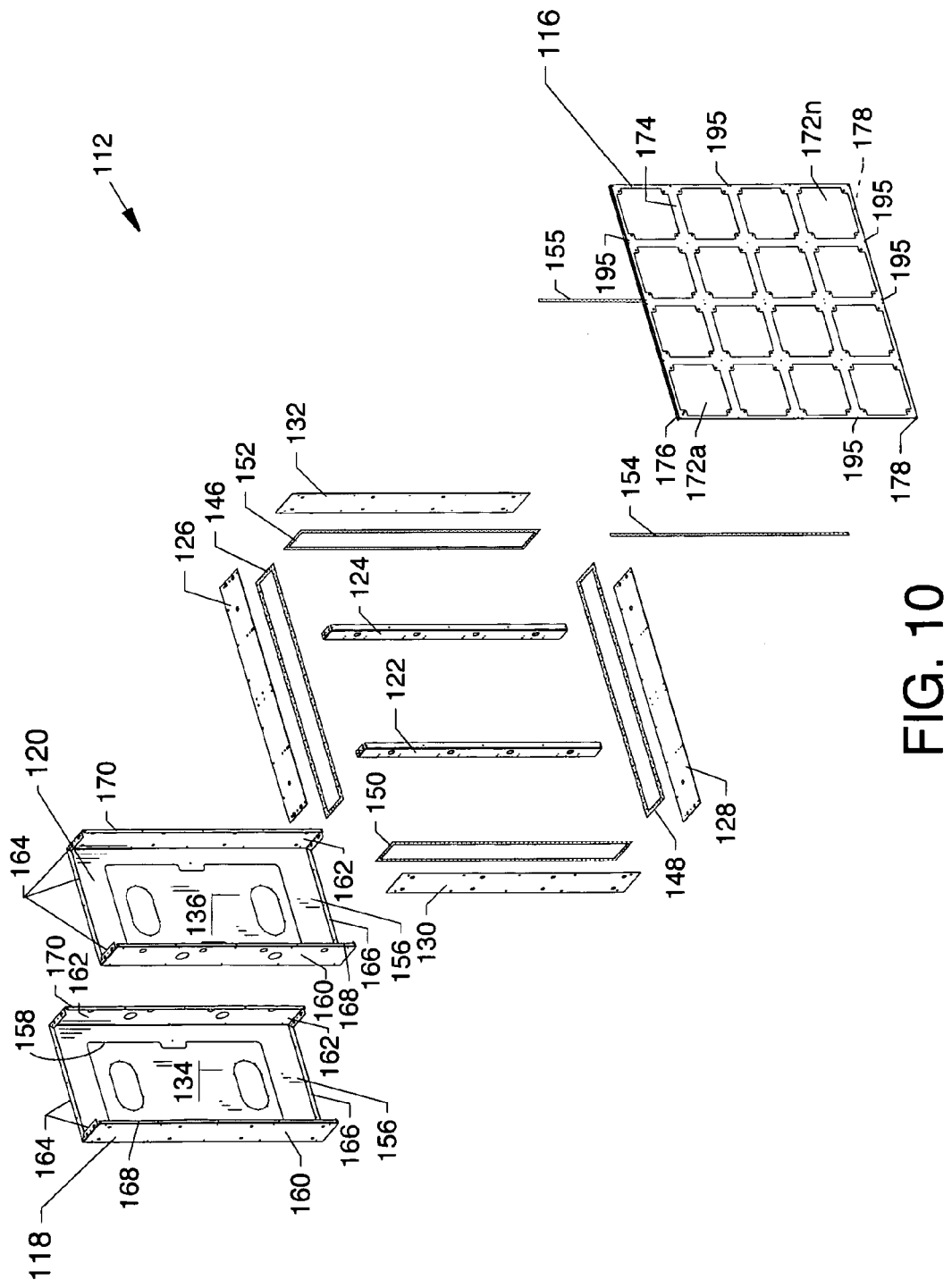
FIG. 10 is a semi-exploded front isometric view of the formed metal cabinet shown in FIG. 8.
Figure 11:
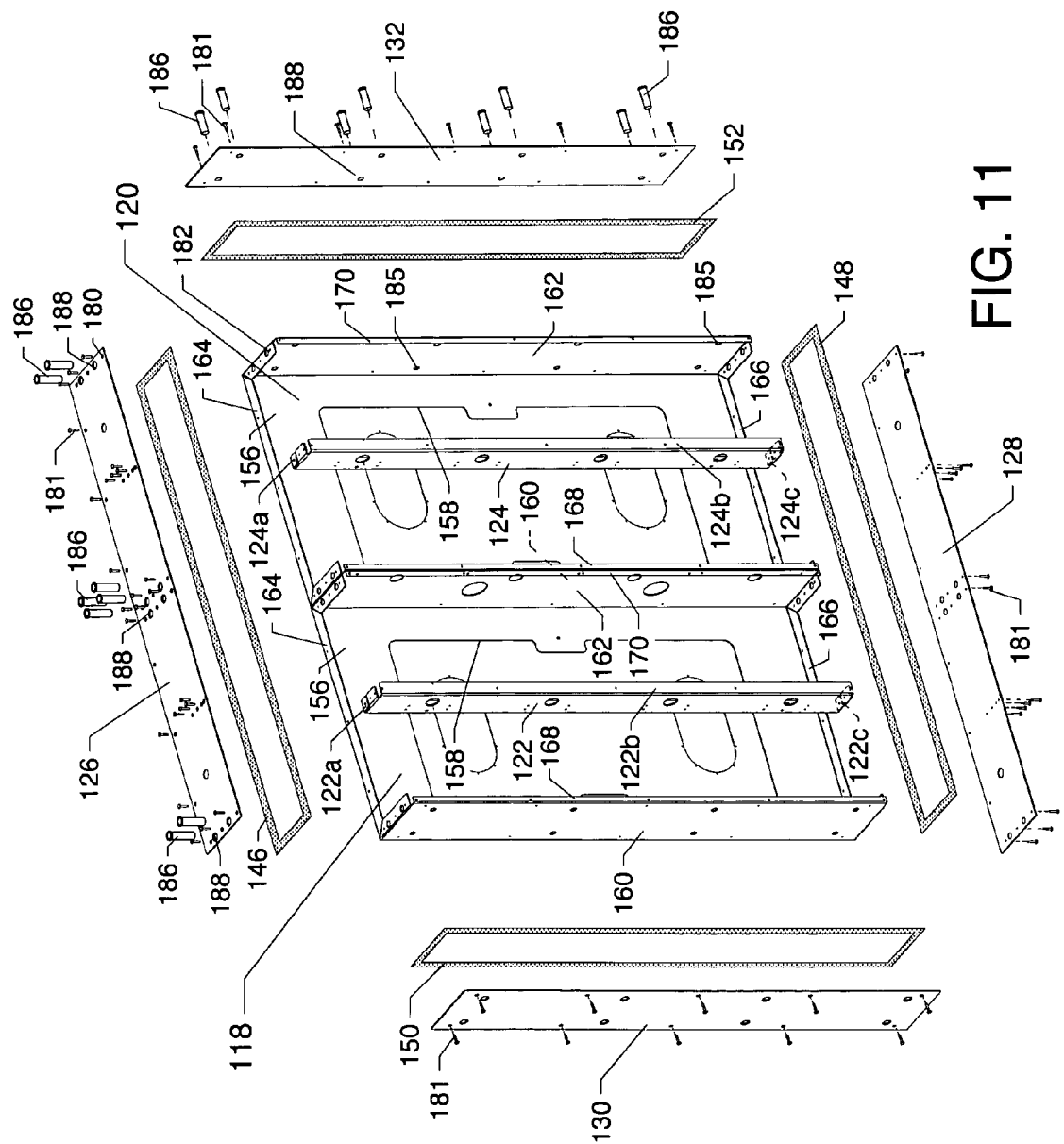
FIG. 11 is a semi-exploded front isometric view of the formed rear channels, formed planar components and other components associated with the central portion of the formed metal cabinet shown in FIG. 8.
Figure 12:
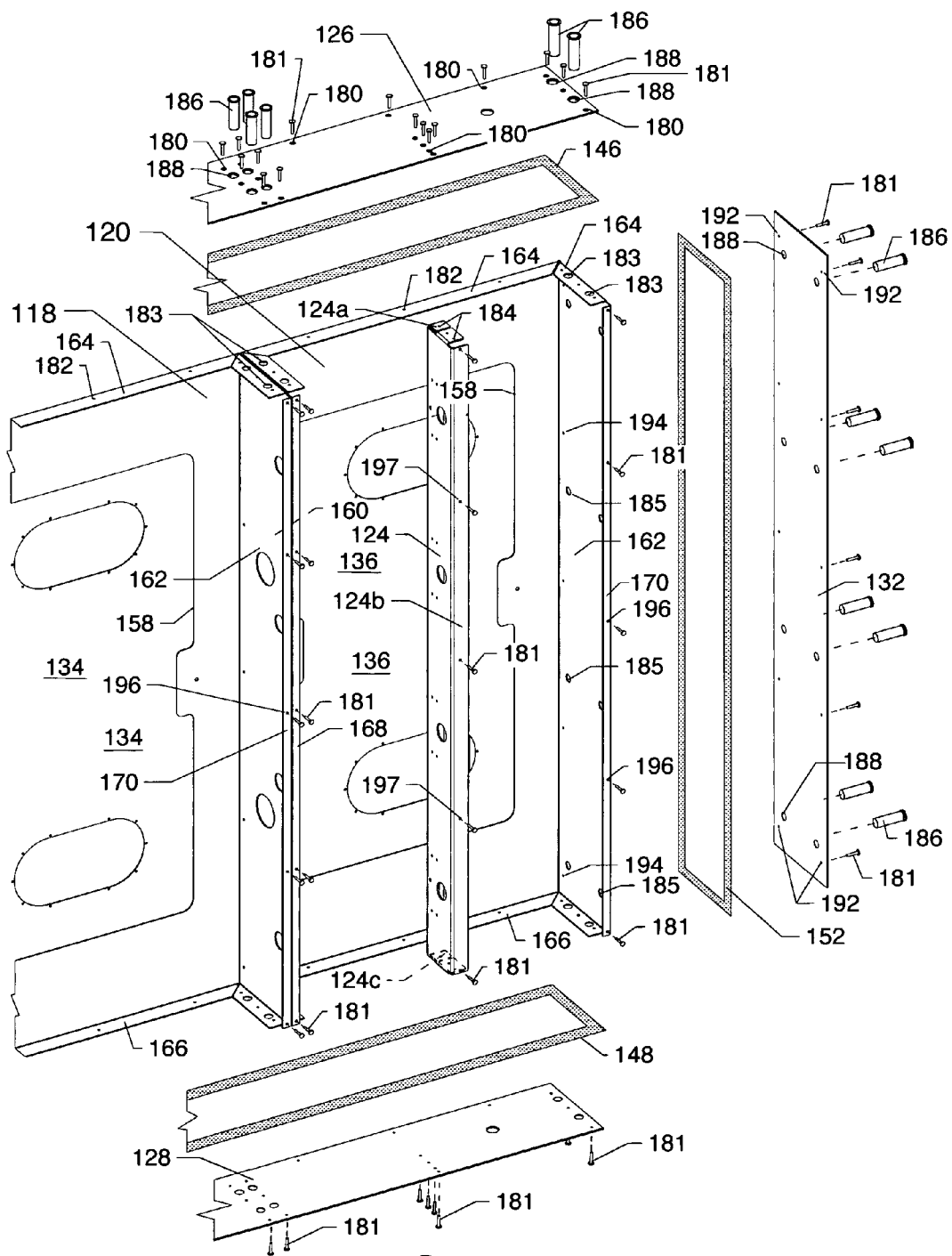
FIG. 12 is an amplified view of one end of the alternative embodiments shown in FIG. 11.

FIGS. 9 and 10 are semi-exploded rear and front isometric views, respectively, of the formed metal cabinet 112, and FIG. 11 is a semi-exploded front isometric view of formed rear channels 118 and 120, formed planar components and other components associated with the central portion of the formed metal cabinet 112. FIG. 12 is an amplified view of one end of the alternative embodiment including components above and below, as well as to one or more sides of a plurality of formed channel components, and other closely associated components. All of the major components are considered to be formed by one or more methods including, but not limited to, punching, bending, laser cutting or combinations thereof with great precision, close tolerance and uniformity. Such formed components can be a panel or a channel or other associated structure, each being utilized to facilitate rapid component assembly and to produce a formed metal cabinet 112 having geometric uniformity and conformity.

The formed metal cabinet 112 includes horizontally and vertically aligned components which are of precisely formed and punched metal configuration including, but not limited to, the formed front mounting channel 116, the formed rear channels 118 and 120, a plurality of formed mid-channels including formed mid-channels 122 and 124, a formed top panel 126, a formed bottom panel 128, formed end panels 130 and 132, a plurality of access doors including rear access doors 134 and 136, a plurality of top door mount channels 138 and 140, and a plurality of bottom door mount channels 142 and 144. Sections of adhesive coated tape 146, 148, 150, 152, 154 and 155 are also provided.

The formed rear channels 118 and 120 of the alternative embodiment are provided, preferably as one or more components which can be used singly or in combination. The plurality of formed rear channels 118 and 120, which provide access to the interior of the formed metal cabinet 112, can be used in attached side-by-side alignment instead of the structure of the rear access panel 64 and the formed channels, such as all or some of the formed channels 18, 20, 22 and 24 of the preferred embodiment. Each of the similarly constructed U-shaped formed rear access panels 118 and 120 includes a planar back 156 with an opening 158 therein, and opposed vertically oriented sidewalls 160 and 162 extending perpendicularly from the planar back 156. Each of the similarly constructed formed rear channels 118 and 120 also includes a U-shaped top lip 164 which extends inwardly and along the top of the planar back 156 and the sidewalls 160 and 162, and an opposed U-shaped bottom lip 166 which extends inwardly and along the bottom of the planar back 156 and the sidewalls 160 and 162. Structure replacing all or some of the full width formed channels 18, 20, 22 and 24 of the preferred embodiment is provided by the intimate alignment and related structure of the full width sidewalls 160 and 162 of adjacent formed rear channels 118 and 120 as shown in FIGS. 11 and 12 which are mutually secured to each other and which extend between the formed front mounting channel 116 and the planar backs 156 of the formed rear channels 118 and 120. Additionally, opposed forwardly located vertically oriented front lips 168 and 170 having a plurality of clench holes 196 are located along the front portion of the sidewalls 160 and 162 for mating and for suitable attachment, such as by rivets 181, to the rear side of the formed front mounting panel 116.

The formed front mounting channel 116 includes a plurality of openings 172a-172n through the front side 174 thereof and a rearwardly extending top lip 176 and a rearwardly extending bottom lip 178 as shown in FIGS. 9 and 10.

The formed mid-channels 122 and 124 of the alternative embodiment are substantially similar to the formed mid-channels 26, 28 and 30 of the preferred embodiment.

Precision punched holes are provided in the various formed metal structures for use with rivets and nut inserts. Holes of various sizes and of one or more styles or descriptions can be used for riveting and for mounting and accommodating nut inserts. For example and illustration, the method of riveting is described with brief reference to FIG. 12, wherein a plurality of counterbored holes 180 are distributed at multiple locations along the formed top panel 126 in order to intimately engage the body of rivets 181 and to accommodate the heads of rivets 181 in a flush fashion. Further, corresponding pluralities of clench holes 182 for intimate binding engagement with the flared bottom and for the passage of rivet bodies are provided for securing the formed top panel 126 to other components, as follows. Clench holes 182 are provided in the top lip 164 of each of the formed rear channels 118 and 120. Clench holes 184 are also provided in the segmented top lip 124a of the formed mid-channel 124. Corresponding clench holes for accommodating rivets 181 are used in mirror image in corresponding like structures such as the formed bottom panel 128 and are utilized in a similar manner for connecting the formed bottom panel 128 to the bottom lips 166 of the formed rear channels 118 and 120 and other like corresponding lips 124c of the formed mid-channel 124. The formed mid-channel 122 (FIG. 11), including a top lip 122a and a bottom lip 122c, is secured in a similar fashion.

Referring to FIG. 12, a plurality of nut inserts 186 can be incorporated into the upper structure of the formed metal cabinet 112. The nut inserts 186 located at the upper region of the formed metal cabinet 112 can be used for the attachment of eye bolts or other suspension hardware. The formed top panel 126 includes a plurality of counterbored holes 188 distributed along and thereabout for flush accommodation of the annular top ring portion of the nut inserts 186, as well as for the accommodation of the tubular section of the nut inserts 186 and for the intimate engagement of the top portion of the nut inserts 186 thereto and therein. A plurality of clench holes 183 in the top lip 164 of the formed rear channels 118 and 120 accommodates the tubular section of the nut inserts 186 for intimate engagement therewith. The formed end panel 132 includes a plurality of counterbored holes 192 which holes accommodate a plurality of rivets 181 which is secured at a plurality of clench holes 194 located along and about the sidewall 162 of the formed rear channel 120. The formed end panel 132 also includes a plurality of counterbored holes 188 which holes accommodate a plurality of nut inserts 186 which are secured at a plurality of clench holes 185 located along and about the sidewall 162 of the formed rear channel 120. The opposed formed end panel 130 (FIG. 11) is secured to the side 160 of the formed rear channel 118 in the same manner.

A plurality of counterbored holes 195 is located along and about the perimeter and along and about the front side 174 of the formed front mounting channel 116 (FIGS. 9 and 10) for accommodating the heads and bodies of rivets 181 in order to attach the formed front mounting channel 116 to the front lips 168 and 170 of the formed rear channels 118 and 120 using clench holes 196 in the front lips 168 and 170 of the formed rear channels 118 and 120. Attachment is also provided by the use of rivets 181 engaging a plurality of clench holes 197 in the front lips 122b and 124b of the formed mid-channels 122 and 124.

Other fastening features and components of the invention are now described with particular reference to FIG. 9. The formed rear channels 118 and 120 each have openings 158 therein for providing access to the interior of the formed metal cabinet 112. Top door mount channels 138 and 140 and bottom door mount channels 142 and 144 are attached by rivets 181 (not shown in FIG. 9) to the formed rear channels 118 and 120 about the top and bottoms of the openings 158 therein. The plurality of removably attachable rear access door panels 134 and 136 are secured about the openings 158 using the top and bottom door mount channels 138, 140, 142 and 144, respectively.

Figure 13:
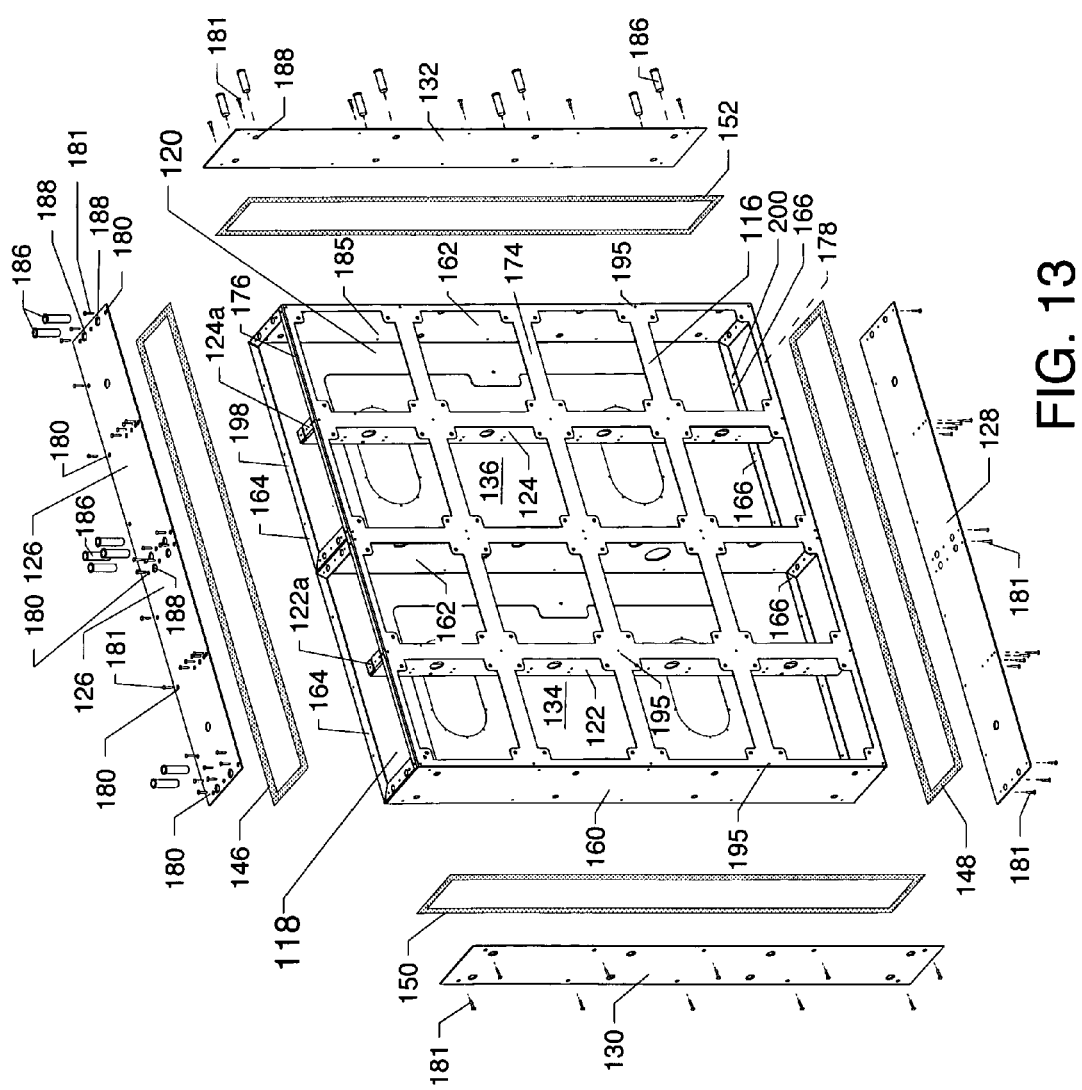
FIG. 13 shows an assembly stage of the centrally located components of the alternative embodiment where the formed mid-channels have been secured between the rear of the formed front mounting channel and the formed rear channels.

FIG. 13 shows an assembly stage of the centrally located components of the alternative embodiment where the formed mid-channels 122 and 124 have been secured to the rear side of the formed front mounting channel 116 by rivets 181 (not shown) extending through the front side 174 of the formed front mounting channel 116 and into the front lips 122b and 124b of the formed mid-channels 122 and 124, respectively. The left vertical portion of the formed front mounting channel 116 has been secured to the vertically aligned front lip 168 of the formed rear channel 118 by the use of rivets 181. The right vertical portion of the formed front mounting channel 116 has been secured to the vertically aligned front lip 170 of the formed rear channel 120 by the use of rivets 181. The central vertical portion of the formed front mounting channel 116 has been secured to the vertically aligned front lip 168 of the formed rear channel 118 and also to the vertically aligned front lip 170 of the formed rear channel 120 by the use of rivets 181. The sidewall 162 of the formed rear channel 118 and the sidewall 160 of the formed rear channel 120 have been mutually secured by the use of rivets, such as rivets 181.

Multiple sections of adhesive coated tapes having an adhesive coating on opposite sides thereof and having a central tape-free and adhesive-free region, or other arrangements of coated tapes having an adhesive coating on opposite sides thereof are provided as sealing and attachment interfaces between the formed components as described in detail herein. The double-sided adhesive coated tapes having a central tape-free and adhesive-free region, such as tapes 146, 148, 150, 152 and tape strips 154 and 155 and other such similar adhesive coated tapes incorporated herein, can be, but are not limited to, 3M 5925 VHB (very high bond) Acrylic Foam Tape which is suitable for indoor or outdoor use. The adhesive coated tapes 154 and 155 in are shown prior to installation in FIGS. 9 and 10 for adhesion and for sealing between the vertically oriented rear perimeter edges of the formed front mounting channel 116 and the front lip 168 of the formed rear channel 118 and the front lip 170 of the formed rear channel 120. Further assembly involves the use of various adhesive sections of adhesive coated tapes 146, 148, 150 and 152 and the use of rivets 181, as shown in FIG. 13. The adhesive coated tape 146 is shown prior to installation for adhesion and for sealing between the formed top panel 126 and the combined top surfaces of other components which form a top rectangular perimeter structure 198 including the top lips 164 of the formed rear channels 118 and 120 and the top lip 176 of the formed front mounting channel 116. The adhesive coated tape 148 is shown prior to installation for adhesion and for sealing between the formed bottom panel 128 and the combined bottom surfaces of other components which form a bottom rectangular perimeter structure 200 including the bottom lips 166 of the formed rear channels 118 and 120 and the bottom lip 178 of the formed front mounting channel 116 The adhesive coated tape 150 is shown prior to installation for adhesion and for sealing between the formed end panel 130 and the sidewall 160 of the formed rear channel 118. The adhesive coated tape 152 is shown prior to installation for adhesion and for sealing between the formed end panel 132 and the sidewall 162 of the formed rear channel 120.

Figure 14:
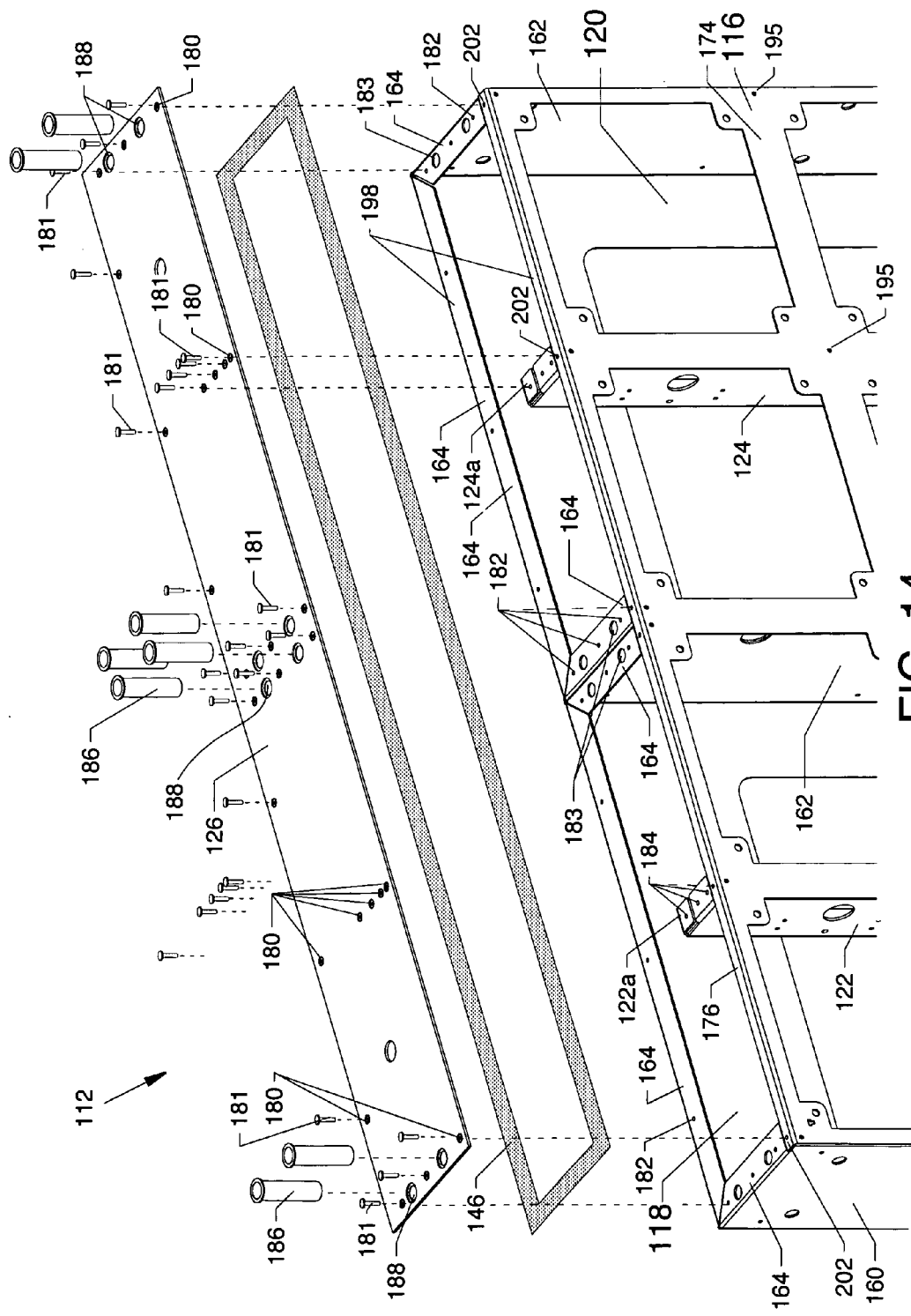
FIG. 14 is a semi-exploded isometric view of the top part of the formed metal cabinet shown in FIG. 13 including the top rectangular perimeter structure; and, FIG. 15 is a partially exploded front view of the alternative embodiment having a formed metal cabinet.

FIG. 14 is a semi-exploded isometric view of the top part of the formed metal cabinet 112 including the top rectangular perimeter structure 198. Clench holes 202 are included extending vertically through the top lip 176 and the bottom lip 178 (not shown) of the formed front mounting channel 116 to accommodate rivets, such as rivets 181, which extend through and secure through forwardly located counterbored holes 180 located at the front edges of the formed top panel 126 and the formed bottom panel 128 (not shown).

Figure 15:
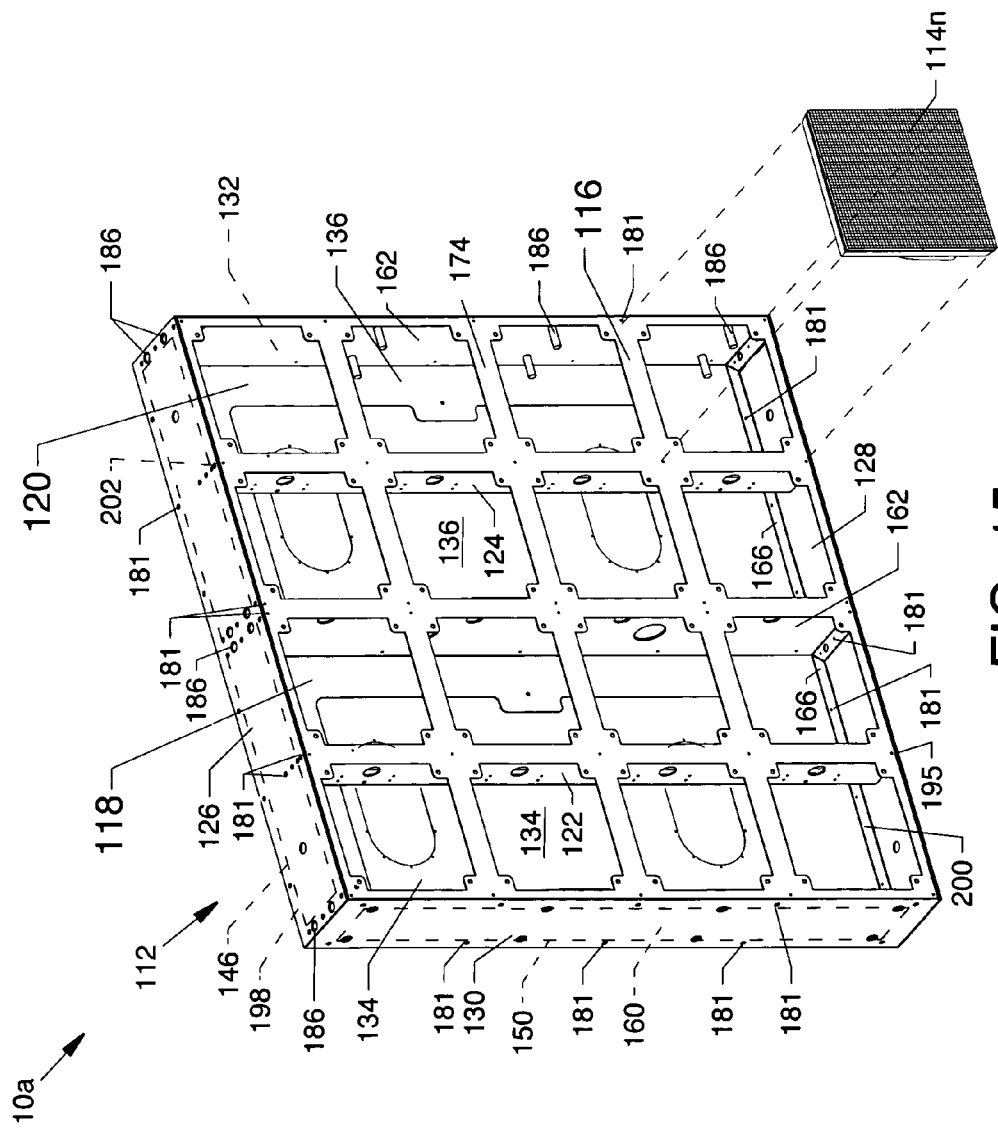

FIG. 15 is a partially exploded front view of the formed metal cabinet 112. The formed top panel 126 is secured to the top rectangular perimeter structure 198 by the use of rivets 181 and nut inserts 186 and by the use of an adhesive coated tape 146 (not shown) therebetween. In a similar fashion, the formed bottom panel 128 is secured to the bottom rectangular perimeter structure 200 by the use of rivets 181 and by the use of an adhesive coated tape 148 (not shown) therebetween. The formed end panel 130 is secured to the sidewall 160 of the formed rear channel 118 by the use of rivets 181 and by the use of an adhesive coated tape 150 therebetween. The formed end panel 132 is secured to the sidewall 162 of the formed rear channel 120 by the use of rivets 181 and by the use of an adhesive coated tape 152 (not shown) therebetween. The formed front mounting channel 116 is shown fastened, as previously described, to the formed mid-channels 122 and 124 and to the front lips 168 and 170 of the formed rear channels 118 and 120 by the use of rivets 181 and by adhesive coated tapes 154 and 155, respectively, (not shown) therebetween.

Various modifications can be made to the present invention without departing from the apparent scope thereof.

PARTS LIST

- 10 electronic sign
- 10a electronic sign
- 12 formed metal cabinet
- 14a-n electronic display modules
- 16 mounting panel
- 18 formed channel
- 18a top lip
- 18b bottom lip
- 18c front side lip
- 18d back side lip
- 18e main panel
- 20 formed channel
- 20a top lip
- 20b bottom lip
- 20c front side lip
- 20d back side lip
- 22 formed channel
- 22a top lip
- 22b bottom lip
- 22c front side lip
- 22d back side lip 24 formed channel
- 24a top lip
- 24b bottom lip
- 24c front side lip
- 24d back side lip
- 26 formed mid-channel
- 26a top lip
- 26b bottom lip
- 26c front side lip
- 26d back side lip
- 28 formed mid-channel
- 30 formed mid-channel
- 32 formed end panel
- 34 formed end panel
- 36 adhesive coated tape
- 38 adhesive coated tape
- 40 formed top channel
- 40a main panel
- 40b front side lip
- 40c back side lip
- 42 formed bottom channel
- 42a main panel
- 42b front side lip
- 42c back side lip
- 43 bracket
- 44 formed top panel
- 45 bracket
- 46 formed bottom panel
- 47 rivets
- 48 adhesive coated tape
- 50 adhesive coated tape
- 52 counter bored holes
- 54 body holes
- 56 clench holes
- 58 clench holes
- 60 clench holes
- 62 clench holes
- 64 rear access panel
- 65 rear rectangular perimeter structure
- 66 nut insert
- 67 front rectangular perimeter structure
- 68 nut insert
- 69 counter bored holes
- 70 structural bracket
- 71 structural bracket 72 counter bored holes
74 body holes
76 clench holes
78 clench holes
80 adhesive coated tape
82 adhesive coated tape
84 counter bored holes
86 clench holes
88 clench holes
89 clench holes
90a-n openings
91 clench holes
92 counter bored holes
94 clench holes
96a-n access door frames
98a-n access door panels
100a counter bored holes
112 formed metal cabinet
114a-n display modules
116 formed front mounting channel
118 formed rear channel
120 formed rear channel
122 formed mid-channel
122a top lip
122b front lip
122c bottom lip
124 formed mid-channel
124a top lip
124b front lip
124c bottom lip
126 formed top panel
128 formed bottom panel
130 formed end panel
132 formed end panel
134 rear access door
136 rear access door
138 top door mount channel
140 top door mount channel
142 bottom door mount channel
144 bottom door mount channel
146 adhesive coated tape
148 adhesive coated tape
150 adhesive coated tape
152 adhesive coated tape
154 adhesive coated tape
155 adhesive coated tape
156 planar back
158 opening
160 sidewall
162 sidewall
164 top lip
166 bottom lip
168 front lip
170 front lip
172a-n openings
174 front side
176 top lip
178 bottom lip
180 counterbored holes
181 rivets
182 clench holes
183 clench holes
184 clench holes
185 clench holes
186 nut inserts
188 counterbored holes
192 counterbored holes
194 counterbored holes
195 counterbored holes
196 clench holes
197 clench holes
198 top rectangular perimeter structure
200 bottom rectangular perimeter structure
202 clench holes It is claimed:

1. A formed metal cabinet for an electronic sign comprising:
a front mounting panel with a plurality of openings therein for accommodating a plurality of electronic display modules, said front mounting panel having a front side and a rear side, said front mounting panel having a top lip and a bottom lip extending inwardly from said rear side;
a pair of adjacently attached elongated rear channels secured to said rear side of said front mounting panel;
an elongated planar top panel;
an elongated planar bottom panel oppositely spaced from said elongated top planar panel;
an elongated right side planar panel;
an elongated left side planar panel oppositely spaced from said elongated right side planar panel; and,
said elongated planar panels being attached to the peripheries of said front mounting panel and said pair of adjacently attached elongated rear channels in the form of a box shaped configuration, each of said pair of adjacently attached elongated rear channels having an opening therein to accommodate a rear access door, and said front mounting panel, said top and bottom elongated planar panels, said pair of adjacently attached elongated rear channels, said elongated right side and left side planar panels being secured together in said box shaped configuration by fastening means, wherein each of said elongated rear channels has a planar front side with a pair of elongated vertically oriented planar side panels extending therefrom and oppositely spaced from each other, wherein each of said elongated rear channels has a top lip and a bottom lip extending inwardly from said planar front side, said top and bottom lips being perpendicular to said planar front side, and wherein each of said elongated rear channels has a top side lip and a bottom side lip extending inwardly from each of said elongated vertically oriented planar panels, each of said side lips being perpendicular to said respective elongated vertically oriented planar panels.

2. The formed metal cabinet of claim 1, wherein said fastening means are rivets, nut inserts and double-sided adhesive coated tapes.

3. The formed metal cabinet of claim 1, wherein each of said elongated planar top, bottom, left and right side panels has a plurality of spaced counter bored holes therein for accommodating a plurality of rivets and nut inserts.

4. The formed metal cabinet of claim 3, wherein each of said top and bottom lips of said front mounting panel, each of said top and bottom lips of said pair of elongated rear channels and each of said outer elongated vertically oriented planar panels of said pair of said elongated rear channels have a plurality of spaced clench holes therein corresponding to said plurality of spaced counter bored holes.

5. The formed metal cabinet of claim 4, wherein each of said elongated left and right side panels of said elongated rear channels has an inwardly extending lip which is parallel to said front side of said front mounting panel.

6. The formed metal cabinet of claim 5, wherein each of said inwardly extending lips of said left and right side panels of said pair of elongated rear channels has a plurality of spaced clench holes therein.

7. The formed metal cabinet of claim 6, wherein said front mounting panel has a plurality of spaced counter bored holes corresponding to said plurality of spaced clench holes in said inwardly extending lips of said right and left side panels of said pair of elongated rear channels.

8. The formed metal cabinet of claim 7, wherein said front mounting panel is attached to said pair of elongated rear channels by means of rivets through said plurality of spaced counter bored holes in said front mounting panel and through said corresponding clench holes in said inwardly extending lips of said pair of elongated rear channels.

9. The formed metal cabinet of claim 8, wherein said elongated planar top, bottom, left and right side panels are attached to said pair of elongated rear channels by means of rivets and nut inserts through said plurality of counter bored holes in said panels and through said corresponding clench holes in said pair of elongated rear channels.

10. The formed metal cabinet of claim 9, wherein a double-sided adhesive coated tape is sandwiched between said top planar panel and said top lips of said front mounting panel and said pair of elongated rear channels and wherein a double-sided adhesive coated tape is sandwiched between said bottom planar panel and said bottom lips of said front mounting panel and said pair of elongated of elongated rear channels.

11. The formed metal cabinet of claim 10, wherein each of said double-sided adhesive coated tapes has a rectangular shape with a rectangular shaped opening therein.

12. The formed metal cabinet of claim 11, wherein a double-sided adhesive coated tape is sandwiched between said elongated right side planar panel and said right outer side panel of one of said pair of elongated rear channels and wherein a double-sided adhesive coated tape is sandwiched between said elongated left side planar panel and said left outer side panel of said other elongated rear channel.

13. The formed metal cabinet of claim 12, wherein each of said double-sided adhesive tapes has a rectangular shape with a rectangular shaped opening therein.

14. The formed metal cabinet of claim 13, wherein a double-sided adhesive coated tape is sandwiched between the left and right side edges of said front mounting panel and corresponding outer edges of said planar side panels of said pair of elongated rear channels.

15. The formed metal cabinet of claim 14, wherein an elongated vertically oriented mid-channel is secured between each of said pair of elongated rear channels and said front mounting panel by means of rivets.

16. The formed metal cabinet of claim 1, wherein said rear access door in each of said elongated rear channels is supported between a top and bottom mount channel in each of said openings of said pair of elongated rear channels.

17. The formed metal cabinet of claim 1, wherein said panels and elongated rear channels are constructed from sheet metal.

18. A formed metal cabinet for an electronic sign comprising:
a front mounting panel with a plurality of openings therein for accommodating a plurality of electronic display modules, said front mounting panel having a front side and a rear side, said front mounting panel having a top lip and a bottom lip extending inwardly from said rear side;
a pair of adjacently attached elongated rear channels secured to said rear side of said front mounting panel;
an elongated planar top panel;
an elongated planar bottom panel oppositely spaced from said elongated top planar panel;
an elongated right side planar panel;
an elongated left side planar panel oppositely spaced from said elongated right side planar panel; and,
said elongated planar panels being attached to the peripheries of said front mounting panel and said pair of adjacently attached elongated rear channels in the form of a box shaped configuration, each of said pair of adjacently attached elongated rear channels having an opening therein to accommodate a rear access door, and said front mounting panel, said top and bottom elongated planar panels, said pair of adjacently attached elongated rear channels, said elongated right side and left side planar panels being secured together in said box shaped configuration by fastening means, wherein said pair of adjacently attached elongated rear channels are attached together by a plurality of spaced rivets along a pair of mutually contacting vertically oriented side walls of said pair of elongated rear channels.

19. The formed metal cabinet of claim 18, wherein each of said elongated rear channels has a planar front side with a pair of elongated vertically oriented planar side panels extending therefrom and oppositely spaced from each other.

20. The formed metal cabinet of claim 19, wherein each of said elongated rear channels has a top lip and a bottom lip extending inwardly from said planar front side, said top and bottom lips being perpendicular to said planar front side.

* * * * *